(12) United States Patent
Huang et al.

(10) Patent No.: US 9,203,387 B2
(45) Date of Patent: Dec. 1, 2015

(54) DELAY LINE CIRCUIT WITH VARIABLE DELAY LINE UNIT

(71) Applicant: TAIWAN SEMICONDUCTOR MANUFACTURING COMPANY, LTD., Hsinchu (TW)

(72) Inventors: Ming-Chieh Huang, San Jose, CA (US); Chan-Hong Chern, Palo Alto, CA (US); Tsung-Ching Huang, Mountain View, CA (US); Chih-Chang Lin, San Jose, CA (US); Fu-Lung Hsueh, Kaohisung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 73 days.

(21) Appl. No.: 14/187,951

(22) Filed: Feb. 24, 2014

(65) Prior Publication Data

US 2015/0244357 A1    Aug. 27, 2015

(51) Int. Cl.
 H03H 11/26    (2006.01)
 H03K 5/14     (2014.01)
 H03K 5/00     (2006.01)

(52) U.S. Cl.
 CPC ........ *H03K 5/14* (2013.01); *H03K 2005/00019* (2013.01)

(58) Field of Classification Search
 USPC .......................... 327/261, 276–278, 284–285
 See application file for complete search history.

(56) References Cited

U.S. PATENT DOCUMENTS 5,192,886 A * 3/1993 Wetlaufer ...................... 327/158
6,175,605 B1 * 1/2001 Chi ................................ 375/371

* cited by examiner

*Primary Examiner* — An Luu
(74) *Attorney, Agent, or Firm* — Hauptman Ham, LLP

(57) ABSTRACT

A delay line circuit comprises a plurality of delay units configured to receive an input signal and modify the input signal to produce a first output signal. The delay line circuit also comprises a variable delay line unit that comprises an input end configured to receive the first output signal; an output end configured to output a second output signal; a first line between the input end and the output end, the first line comprising, in series, a first inverter, a second inverter, a first speed control unit, and a third inverter; a second line between the input end and the output end, the second line comprising, in series, a fourth inverter, a second speed control unit, a fifth inverter, and a sixth inverter. The delay line circuit is also configured to selectively transmit the received first output signal through one of the first line or the second line.

20 Claims, 5 Drawing Sheets

DELAY LINE CIRCUIT WITH VARIABLE DELAY LINE UNIT

BACKGROUND

Device manufacturers are challenged to deliver value and convenience to consumers by, for example, developing integrated circuits that provide quality performance. Double Data Rate circuits use delay lines and delay data or clock delays to achieve appropriate signal timing in a data transmission. Delay lines impart linear steps that are used to tune a received input signal. Inconsistent step variations, or delay, increase clock jitter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
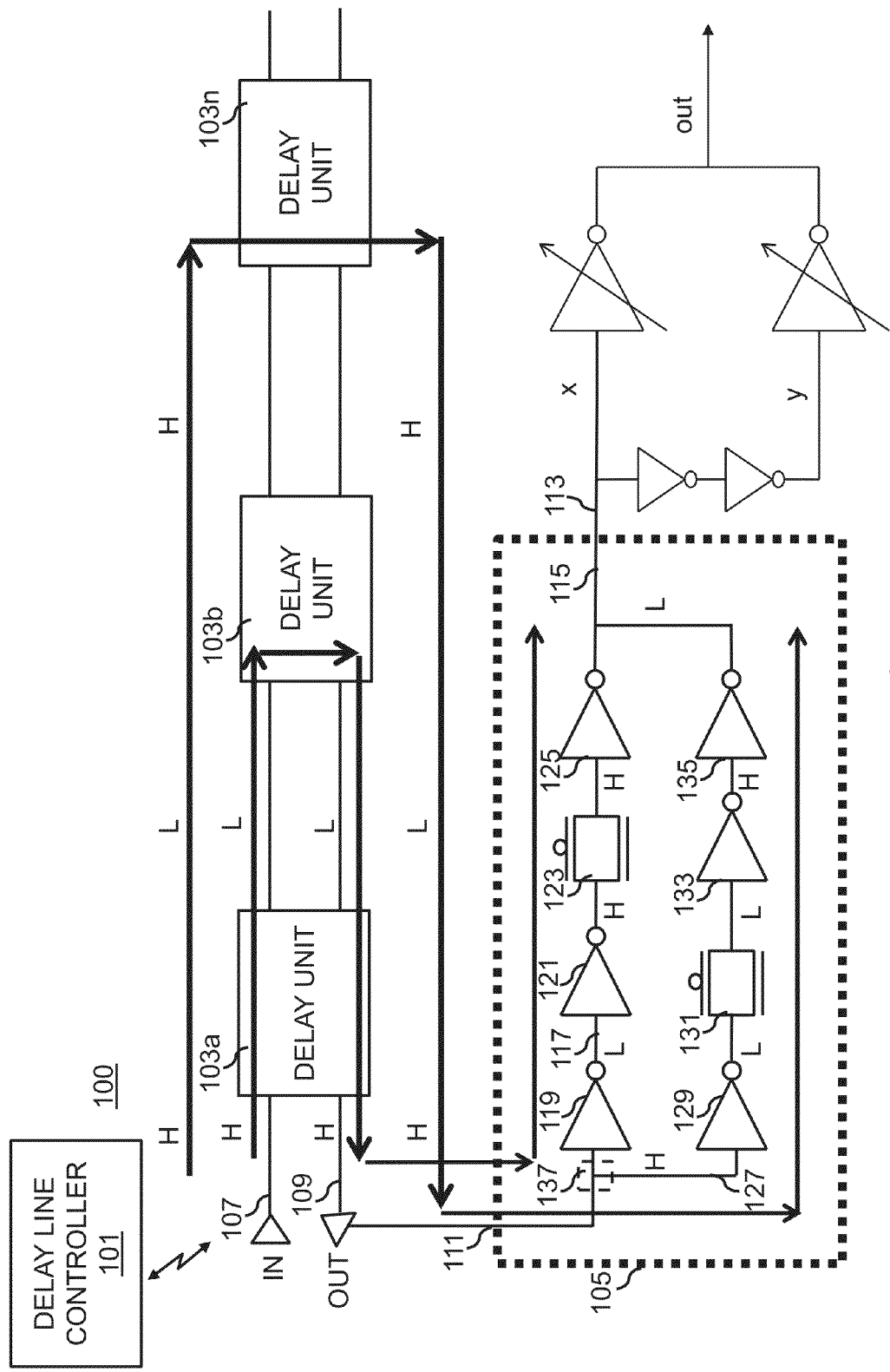
FIG. 1 is a diagram of a system configured to provide fine tuning steps with consistent step delay variation, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

High-speed synchronous integrated circuits, such as microprocessors and memories, have tightly aligned clock signals in operation. Double data rate ("DDR") synchronous dynamic random access memory ("SDRAM") is an application where clock synchronization is important. It is common for many DDR-SDRAM components to be placed in parallel on a system to create a wide bandwidth for data transfer. To ensure that the data bits are aligned, each component uses a clock synchronization circuit to align its outputs with a system clock.

As DDR applications are becoming more popular in system on chip designs, some DDR systems, e.g., DDR4 systems, are capable of achieving data speeds of approximately 3.3 GHz. DDR systems use delay lines and delay data or clock delays to achieve appropriate signal timing in a data transmission. Delay lines impart linear steps that are used to tune a received input signal. Inconsistent step variations, or delay, increase clock jitter. Jitter is the amount of phase error on the output when the input is constant, which introduces noise to the signal.

High speed DDR systems are often tuned by coarse tuning and fine tuning. Conventional high speed DDR systems introduce steps that often have delays in the 6-8 picosecond range. But, step delays in the 6-8 picosecond range introduce jitter, not only because of the size of the delay, but also because there is significant variation between these delays of each step.

FIG. 1 is a diagram of a system 100 configured to provide fine tuning steps with consistent step delay variation, in accordance with one or more embodiments.

The system 100 is configured to provide a tunable delay that is digitally controlled by an internal delay engine or controller. The system 100 is configured to provide a large enough delay for low speed applications and a small enough delay for high speed applications. For example, the system 100 is capable of providing a tunable delay for low speed or low frequency signals having a signal frequency of about 800 MHz, or lower, to high speed or high frequency signals having a signal frequency of about 3200 MHz or greater, and anywhere in between. The tunable delay made possible by the system 100 is capable of providing constant delay steps for performance verification test ("PVT") combinations. In other words, stage delay is capable of having no PVT dependence. In at least some embodiments, the system 100 provides constant delay steps for all PVT combinations.

The system 100 comprises a delay line controller 101, a plurality of delay units 103a-103n (collectively referred to as "delay unit 103"), and a variable delay line unit 105. The plurality of delay units 103 are configured to receive an input signal 107 and modify the input signal to produce a first output signal 109 by delaying the input signal 107. The plurality of delay units 103 are configured to selectively invert or relay the input signal 107 en route to producing the first output signal 109. The delay line controller 101 is configured to selectively cause the input signal 107 to be received, processed, and output by a specified number of the plurality of delay units 103 to produce the first output signal 109.

For example, input signal 107, if the delay line controller 101 causes the input signal 107 to be transmitted through delay units 103a and 103b, is inverted from a data high (i.e., H) phase to a data low (i.e., L) phase by delay unit 103a and relayed in the same phase, i.e. L phase by delay unit 103b back to delay unit 103a. Delay unit 103a then inverts input signal 107 from the L phase to the H phase and output signal 109 is produced. Output signal 109 is delayed, for example, by passing through two delay units 103. Alternatively, if the delay line controller 101 causes the input signal 107 to be transmitted through delay units 103a, 103b and 103c (not shown because the system 100 is configurable to comprise n delay units 103), input signal 107 is inverted from H phase to L phase by delay unit 103a, inverted from L phase to H phase by delay unit 103b, and relayed in the same phase, i.e., H phase, by delay unit 103c back to delay unit 103b. Delay unit 103b then inverts input signal 107 from the H phase to the L phase and delay unit 103a inverts the input signal 107 from the L phase to the H phase. First output signal 109 is accordingly produced. First output signal 109 passing through delay units 103a-103c is delayed further if compared to the previous example because the input signal 107 passed through three delay units 103.

The variable delay line unit 105 is configured to receive the first output signal 109. The variable delay line unit 105 comprises an input end 111 configured to receive the first output signal 109. The variable delay line unit 105 also comprises an output end 113 configured to output a second output signal 115. The variable delay line unit 101 further comprises a first line 117 between the input end 111 and the output end 113, the first line comprising, in series, a first inverter 119, a second inverter 121, a first speed control unit 123, and a third inverter 125. The variable delay line unit 105 additionally comprises a second line 127 between the input end 111 and the output end 113, the second line 127 comprising, in series, a fourth inverter 129, a second speed control unit 131, a fifth inverter 133, and a sixth inverter 135.

The delay line controller 101 is configured to selectively cause the first output signal 109 to be transmitted through one of the first line 117 or the second line 127 by controlling operation of the first inverter 119, the second inverter 121, the third inverter 125, the fourth inverter 129, the fifth inverter 133, and the sixth inverter 135 to direct the first output signal 109 through the first line 117 or the second line 127 based on a determination that the input signal 107 passed through an even or an odd number of delay units 103.

In some embodiments, the variable delay line unit 105 optionally comprises a switch 137 configured to selectively cause the received first output signal 109 to be transmitted through one of the first line 117 or the second line 127 based on an instruction received from the delay line controller 101. The delay controller 101 actuates the switch 137 to transmit the received first output signal 109 through the first line 117 or the second line 127 based on a determination that the input signal 107 passed through an even or an odd number of delay units 103.

In some embodiments, the first speed control unit 123 and the second speed control unit 131 are pass gates. In other embodiments, the first speed control unit 123 and the second speed control unit are loading nodes configured to supply a voltage to the signal transmitted through the first line 117 or the second line 127. For example, the delay line controller 101, in some embodiments, causes the first speed control unit 123 or the second speed control unit 131 to be at a logical [1] or a logical [0] to supply a predetermined voltage at the first speed control unit 123 or the second speed control unit 131 which, in turn, causes a resistance in the first line 117 or the second line 121 to increase or decrease, the speed of the first output signal 109 transmitted through the variable delay line unit 105.

The delay line controller 101, together with the variable delay line unit 105, is configured to cause, in a fine tuning mode, the second output signal 115 to have a number of fine tuning steps, each fine tuning step being delayed from a previous fine tuning step by a specified constant time delay. For example, a coarse tune of the input signal 107 en route to producing the second output signal 115, in some embodiments, yields one step. The one step of the coarse tune is broken into eight steps in the fine tuning mode. The specified constant time delay between any of the steps in the fine tuning mode is in a range of about 2 picoseconds to about 3 picoseconds. Similarly, the same time delay occurs between a last step of the eight steps and a next first step of a next set of eight steps in the second output signal 115. In some embodiments, the specified constant time delay is a specific value in the range of about 2 picoseconds to about 3 picoseconds. In other embodiments, the specified constant time delay is any value that constantly falls within the range of about 2 picoseconds to about 3 picoseconds. A constant time delay within the specified range of about 2 picoseconds to about 3 picoseconds provides a time delay that is suitable for low speed and high speed data rates. Additionally, having a step delay that falls into the 2 to 3 picosecond range makes it possible for the system 100 to reduce the variation, if any, between each fining tuning step compared to conventional high speed DDR systems. For example, in some embodiments, if any variation in step delay occurs between the fine tuning steps, such variation is between about 0.5 picoseconds and about 1.0 picosecond.

Figure 5:
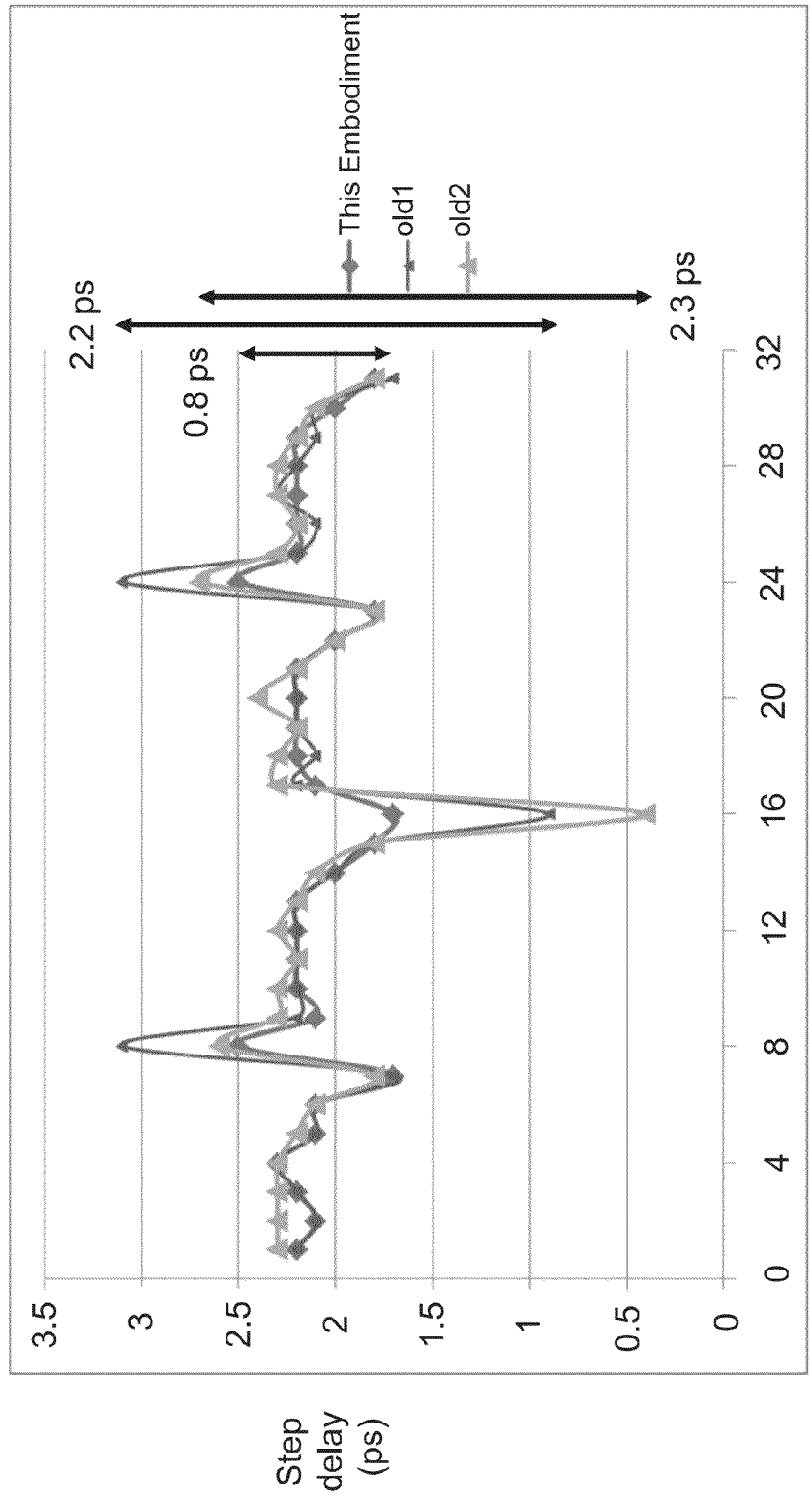
FIG. 5 illustrates pre-layout simulation results comparing step delay variation of the discussed system to step delay variation of conventional high speed DDR systems, in accordance with one or more embodiments.

A pre-layout simulation comparing the step delay variation of the system 100 to the step delay variation of two conventional high speed DDR systems was such as those discussed above yielded a step delay variation of about 0.8 picoseconds between minimum and maximum step delays for the pre-layout simulation of the system 100. But, the step delay for the two simulated conventional high speed DDR systems under the same test conditions was about 2.2 picoseconds for a first conventional high speed DDR system and about 2.3 picoseconds for a second conventional high speed DDR system between minimum and maximum step delays. The system 100, in the discussed simulation, accordingly, yielded a 36.4% improvement in step delay variation compared to conventional high speed DDR systems which indicates that the step delay between the fine tuning steps of the system 100 in the fine tuning mode are more constant than the step delay between fine tuning steps of conventional high speed DDR systems, thereby reducing or eliminating jitter. The results of the discussed pre-layout simulation are illustrated in FIG. 5. The illustrated simulation was performed for a slow slow (SS) process corner at 0.85V.

Pre-layout and post-layout simulations were similarly conducted for other process corners (e.g. fast slow and slow fast), the SS process corner, and for other loadings. The other pre-layout and post-layout simulations indicated that the step variation for conventional high speed DDR systems worsened while the step delay variation for the system 100 remained within the discussed 0.5 picosecond to 1.0 picosecond range or were further improved compared to the conventional high speed DDR systems. As such, the system 100 exhibited process, voltage, temperature (PVT) independence as compared to conventional high speed DDR systems, and was further improved compared to conventional high speed DDR systems when simulated at higher speeds.

Figure 2:
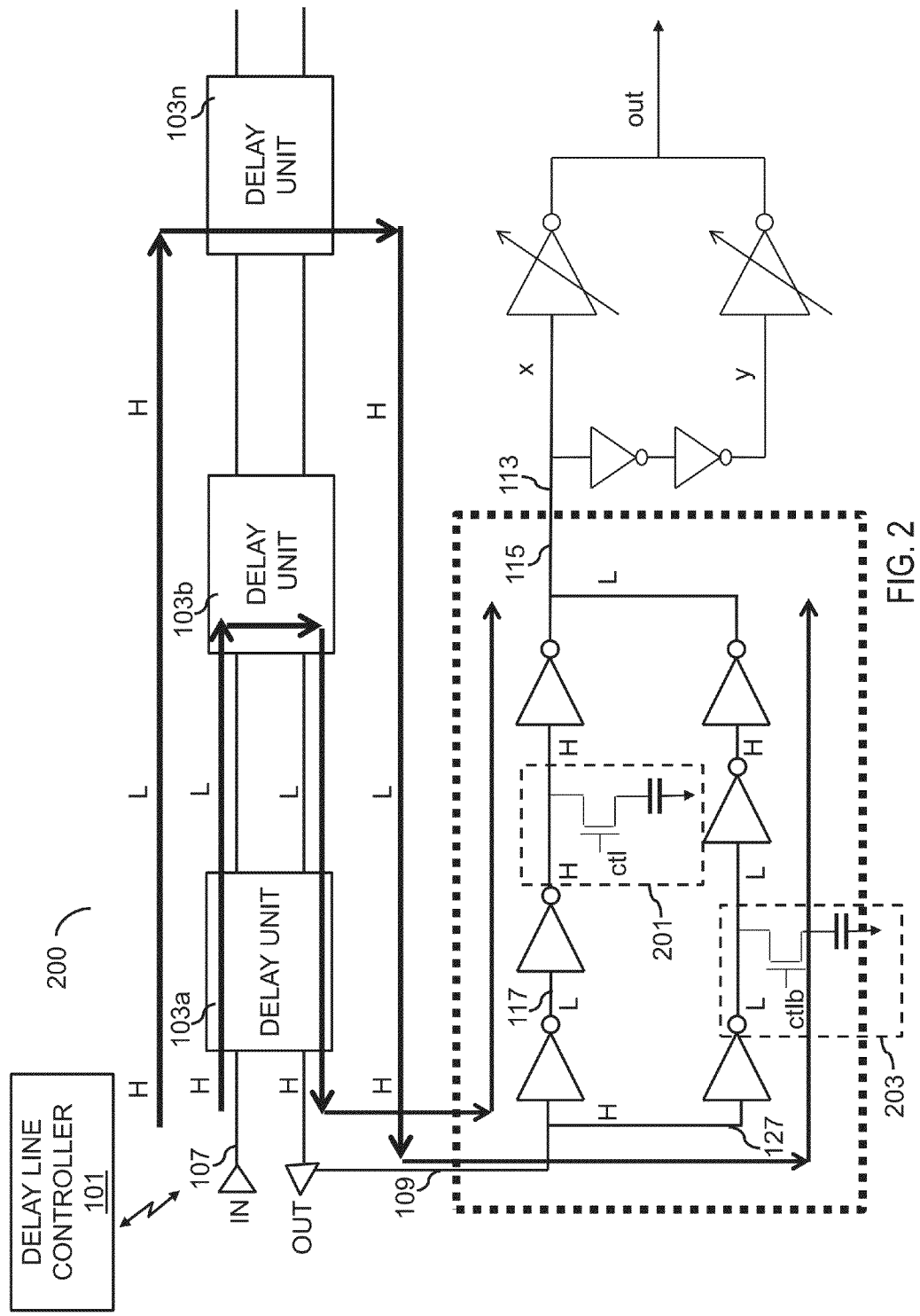
FIG. 2 is a diagram of a system having speed control units that are loading nodes, in accordance with one or more embodiments.

FIG. 2 is a diagram of a system 200 having speed control units that are loading nodes, in accordance with one or more embodiments.

The system 200, which comprises many of the features discussed with respect to system 100 (FIG. 1), is configured to provide fine tuning steps with consistent step delay variation. In this example, the first output signal 109 transmitted through either of the first line 117 or the second line 127 goes through loading nodes 201 or 203 between the input end 111 and the output end 113. The delay line controller 101 transmits an instruction via control signal ctl or ctlb to loading node 201 or 203 to supply the specified voltage to the first output signal 109 transmitted through the variable delay line unit 105 en route to producing the second output signal 115.

Figure 3:
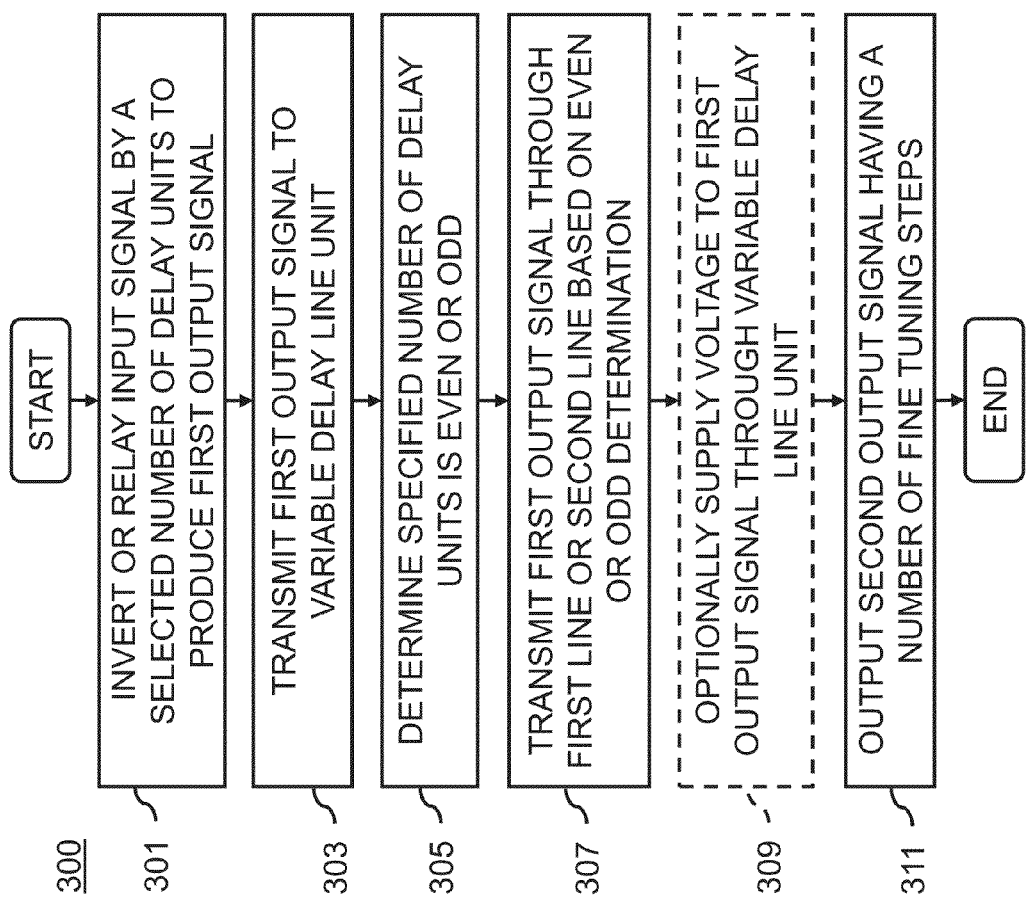
FIG. 3 is a flow chart of a method of providing fine tuning steps with consistent step delay variation, in accordance with one or more embodiments.

FIG. 3 is a flow chart of a method 300 of providing fine tuning steps with consistent step delay variation, in accordance with one or more embodiments. Method 300 begins with step 301 in which a processor such as processor 403 or a control module implemented in chip set 400 discussed in FIG. 4, such as delay line controller 101 (FIG. 1), executes an instruction to selectively invert or relay a received input signal by a plurality of delay units to produce a first output signal based on a first instruction received from a delay line controller. The input signal is received, processed, and output by a specified number of the plurality of delay units to produce the first output signal based on the first instruction received from the delay line controller.

In step 305, the first output signal is transmitted to a variable delay line unit configured to receive the first output signal and modify the first output signal to produce a second output signal.

In step 307, a determination is made whether the specified number of the plurality of delay units is even or odd.

In step 307, the received first output signal is selectively transmitted through one of a first line or a second line of the variable delay line unit based on a second instruction received from the delay line controller. The second instruction to transmit the received first output signal through the first line or the second line is based on the determination that the input signal passed through an even or an odd number of delay units. The first line comprises, in series, a first inverter, a second inverter, a first speed control unit, and a third inverter. The second line comprises, in series, a fourth inverter, a second speed control unit, a fifth inverter, and a sixth inverter.

In some embodiments, the first speed control unit and the second speed control unit are pass gates. In other embodiments, the first speed control unit and the second speed control unit are loading nodes. As such, the process 300 optionally includes step 309 in which a voltage is selectively supplied to the signal transmitted through the first line or the second line.

In step 311, the input signal is fine tuned by causing the variable delay line unit to output second output signal having a number of fine tuning steps, each fine tuning step being delayed from a previous fine tuning step by a specified constant time delay. The specified constant time delay is in a range of about 2 picoseconds to about 3 picoseconds.

The processes described herein for providing fine tuning steps with consistent step delay variation may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 4:
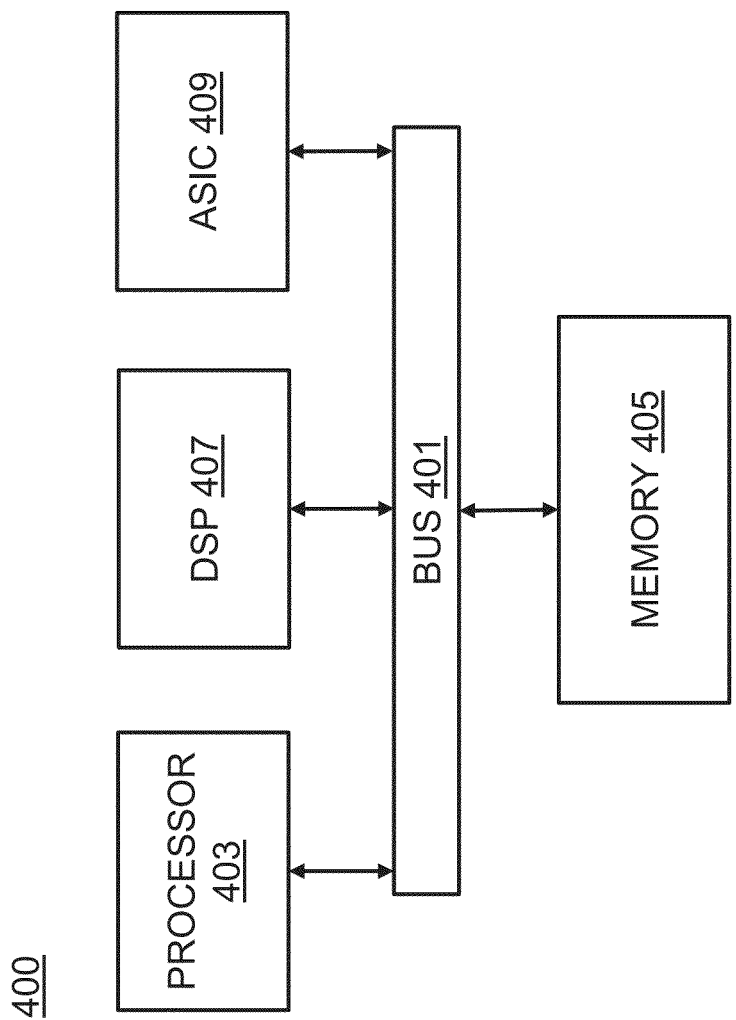
FIG. 4 illustrates a chip set or chip upon which or by which an embodiment is implemented.

FIG. 4 illustrates a chip set or chip 400 upon which or by which an embodiment is implemented. Chip set 400 is programmed to provide fine tuning steps with consistent step delay variation, as described herein, and includes, for example, bus 401, processor 403, memory 405, DSP 407 and ASIC 409 components.

The processor 403 and memory 405 are incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 400 are implemented in a single chip. It is further contemplated that in certain embodiments the chip set or chip 400 is implemented as a single "system on a chip." It is further contemplated that in certain embodiments a separate ASIC would not be used, for example, and that all relevant functions as disclosed herein would be performed by a processor or processors, e.g., processor 403. Chip set or chip 400, or a portion thereof, constitutes a mechanism for performing one or more steps of providing fine tuning steps with consistent step delay variation.

In one or more embodiments, the chip set or chip 400 includes a communication mechanism such as bus 401 for passing information among the components of the chip set 400. Processor 403 has connectivity to the bus 401 to execute instructions and process information stored in, for example, the memory 405. In some embodiments, the processor 403 is also accompanied with one or more specialized components to perform certain processing functions and tasks such as one or more digital signal processors (DSP) 407, or one or more application-specific integrated circuits (ASIC) 409. A DSP 407 typically is configured to process real-world signals (e.g., sound) in real time independently of the processor 403. Similarly, an ASIC 409 is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 403 performs a set of operations on information as specified by computer program code related to providing fine tuning steps with consistent step delay variation. The computer program code is a set of instructions or statements providing instructions for the operation of the processor and/or the computer system to perform specified functions.

The processor 403 and accompanying components have connectivity to the memory 405 via the bus 401. The memory 405 includes one or more of dynamic memory (e.g., RAM, magnetic disk, writable optical disk, etc.) and static memory (e.g., ROM, CD-ROM, etc.) for storing executable instructions that when executed perform the steps described herein to provide fine tuning steps with consistent step delay variation. The memory 405 also stores the data associated with or generated by the execution of the steps.

In one or more embodiments, the memory 405, such as a random access memory (RAM) or any other dynamic storage device, stores information including processor instructions for providing fine tuning steps with consistent step delay variation. Dynamic memory allows information stored therein to be changed by system 100. RAM allows a unit of information stored at a location called a memory address to be stored and retrieved independently of information at neighboring addresses. The memory 405 is also used by the processor 403 to store temporary values during execution of processor instructions. In various embodiments, the memory 405 is a read only memory (ROM) or any other static storage device coupled to the bus 401 for storing static information, including instructions, that is not changed by the system 100. Some memory is composed of volatile storage that loses the information stored thereon when power is lost. In some embodiments, the memory 405 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 403, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, or another medium from which a computer can read. The term computer-readable storage medium is used herein to refer to a computer-readable medium.

One aspect of this description relates to a delay line circuit comprising a plurality of delay units configured to receive an input signal and modify the input signal to produce a first output signal, the plurality of delay units being configured to selectively invert or relay the input signal en route to producing the first output signal based on a first instruction received from a delay controller. The delay line circuit also comprises a variable delay line unit configured to receive the first output signal.

The variable delay line unit comprises an input end configured to receive the first output signal. The variable delay line also comprises an output end configured to output a second output signal. The variable delay lines further comprises a first line between the input end and the output end, the first line comprising, in series, a first inverter, a second inverter, a first speed control unit, and a third inverter. The variable delay line additionally comprises a second line between the input end and the output end, the second line comprising, in series, a fourth inverter, a second speed control unit, a fifth inverter, and a sixth inverter. The received first output signal is selectively transmitted through one of the first line or the second line based on a second instruction received from the delay line controller.

Another aspect of this description relates to an apparatus comprising a delay line controller, a plurality of delay units, and a variable delay line unit. The plurality of delay units are configured to receive an input signal and modify the input signal to produce a first output signal, the delay line controller being configured to selectively cause the input signal to be received, processed, and output by a specified number of the plurality of delay units to produce the first output signal. The variable delay line unit is configured to receive the first output signal.

The variable delay line unit comprises an input end configured to receive the first output signal. The variable delay line unit also comprises an output end configured to output a second output signal. The variable delay line unit further comprises a first line between the input end and the output end, the first line comprising, in series, a first inverter, a second inverter, a first speed control unit, and a third inverter. The variable delay line unit additionally comprises a second line between the input end and the output end, the second line comprising, in series, a fourth inverter, a second speed control unit, a fifth inverter, and a sixth inverter. The received first output signal is selectively transmitted through one of the first line or the second line based on a second instruction received from the delay line controller.

Still another aspect of this description relates to a method comprising selectively inverting or relaying a received input signal by a plurality of delay units to produce a first output signal based on a first instruction received from a delay line controller. The method also comprises transmitting the first output signal to a variable delay line unit configured to receive the first output signal and modify the first output signal to produce a second output signal. The method further comprises transmitting the received first output signal selectively through one of a first line or a second line of the variable delay line unit based on a second instruction received from the delay line controller, the first line comprising, in series, a first inverter, a second inverter, a first speed control unit, and a third inverter, and the second line comprising, in series, a fourth inverter, a second speed control unit, a fifth inverter, and a sixth inverter. The input signal is received, processed, and output by a specified number of the plurality of delay units to produce the first output signal based on the first instruction received from the delay line controller.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A delay line circuit comprising:
   a plurality of delay units configured to receive an input signal and modify the input signal to produce a first output signal, the plurality of delay units being configured to selectively invert or relay the input signal en route to producing the first output signal based on a first instruction received from a delay controller; and
   a variable delay line unit configured to receive the first output signal, the variable delay line unit comprising:
      an input end configured to receive the first output signal;
      an output end configured to output a second output signal;
      a first line between the input end and the output end, the first line comprising, in series, a first inverter, a second inverter, a first speed control unit, and a third inverter; and
      a second line between the input end and the output end, the second line comprising, in series, a fourth inverter, a second speed control unit, a fifth inverter, and a sixth inverter,
   wherein the received first output signal is selectively transmitted through one of the first line or the second line based on a second instruction received from the delay line controller.

2. The delay line circuit of claim 1, wherein the input signal is received, processed, and output by a specified number of the plurality of delay units to produce the first output signal based on the first instruction received from the delay line controller.

3. The delay line circuit of claim 2, wherein the second instruction causes the received first output signal to be transmitted through the first line or the second line based on a determination that the input signal passed through an even or an odd number of delay units.

4. The delay line circuit of claim 1, wherein the first speed control unit and the second speed control unit are pass gates.

5. The delay line circuit of claim 1, wherein the first speed control unit and the second speed control unit are loading nodes configured to supply a voltage to the signal transmitted through the first line or the second line.

6. The delay line circuit of claim 1, wherein, in a fine tuning mode, the variable delay line unit is configured to cause the second output signal to have a number of fine tuning steps, each fine tuning step being delayed from a previous fine tuning step by a specified constant time delay.

7. The delay line circuit of claim 6, wherein the specified constant time delay is in a range of about 2 picoseconds to about 3 picoseconds.

8. An apparatus comprising:
a delay line controller;
a plurality of delay units configured to receive an input signal and modify the input signal to produce a first output signal, the delay line controller being configured to selectively cause the input signal to be received, processed, and output by a specified number of the plurality of delay units to produce the first output signal; and
a variable delay line unit configured to receive the first output signal, the variable delay line unit comprising:
an input end configured to receive the first output signal;
an output end configured to output a second output signal;
a first line between the input end and the output end, the first line comprising, in series, a first inverter, a second inverter, a first speed control unit, and a third inverter; and
a second line between the input end and the output end, the second line comprising, in series, a fourth inverter, a second speed control unit, a fifth inverter, and a sixth inverter,
wherein the received first output signal is selectively transmitted through one of the first line or the second line based on an instruction received from the delay line controller.

9. The apparatus of claim 8, wherein the delay controller causes the received first output signal to be transmitted through the first line or the second line based on a determination that the input signal passed through an even or an odd number of delay units.

10. The apparatus of claim 8, wherein the first speed control unit and the second speed control unit are pass gates.

11. The apparatus of claim 8, wherein the first speed control unit and the second speed control unit are loading nodes configured to supply a voltage to the signal transmitted through the first line or the second line.

12. The apparatus of claim 8, wherein the plurality of delay units are configured to selectively invert or relay the input signal en route to producing the first output signal.

13. The apparatus of claim 8, wherein the delay line controller, together with the variable delay line unit, is configured to cause, in a fine tuning mode, the second output signal to have a number of fine tuning steps, each fine tuning step being delayed from a previous fine tuning step by a specified constant time delay.

14. The apparatus of claim 13, wherein the specified constant time delay is in a range of about 2 picoseconds to about 3 picoseconds.

15. A method comprising:
selectively inverting or relaying a received input signal by a plurality of delay units to produce a first output signal based on a first instruction received from a delay line controller;
transmitting the first output signal to a variable delay line unit configured to receive the first output signal and modify the first output signal to produce a second output signal;
selectively transmitting the received first output signal through a first line or a second line of the variable delay line unit based on a second instruction received from the delay line controller, the first line comprising, in series, a first inverter, a second inverter, a first speed control unit, and a third inverter, and the second line comprising, in series, a fourth inverter, a second speed control unit, a fifth inverter, and a sixth inverter,
wherein the input signal is received, processed, and output by a specified number of the plurality of delay units to produce the first output signal based on the first instruction received from the delay line controller.

16. The method of claim 15, further comprising:
determining if the specified number of the plurality of delay units is even or odd,
wherein the second instruction to transmit the received first output signal through the first line or the second line is based on the determination that the input signal passed through an even or an odd number of delay units.

17. The method of claim 15, wherein the first speed control unit and the second speed control unit are pass gates.

18. The method of claim 15, wherein the first speed control unit and the second speed control unit are loading nodes, the method further comprising:
selectively supplying a voltage to the signal transmitted through the first line or the second line.

19. The method of claim 15, further comprising:
fine tuning the input signal by causing the variable delay line unit to output the second output signal having a number of fine tuning steps, each fine tuning step being delayed from a previous fine tuning step by a specified constant time delay.

20. The method of claim 19, wherein the specified constant time delay is in a range of about 2 picoseconds to about 3 picoseconds.

* * * * *